United States Patent
Etter et al.

(10) Patent No.: US 7,955,941 B2
(45) Date of Patent: Jun. 7, 2011

(54) METHOD OF FORMING AN INTEGRATED SEMICONDUCTOR DEVICE AND STRUCTURE THEREFOR

(75) Inventors: Steven M. Etter, Phoenix, AZ (US); Mingjiao Liu, Gilbert, AZ (US); Ali Salih, Mesa, AZ (US); David D. Marreiro, Phoenix, AZ (US); Sudhama C. Shastri, Phoenix, AZ (US)

(73) Assignee: Semiconductor Components Industries, LLC, Phoenix, AZ (US)

( * ) Notice: Subject to any disclaimer, the term of this patent is extended or adjusted under 35 U.S.C. 154(b) by 86 days.

(21) Appl. No.: 12/208,537

(22) Filed: Sep. 11, 2008

(65) Prior Publication Data

US 2010/0060349 A1 Mar. 11, 2010

(51) Int. Cl.
*H01L 21/8222* (2006.01)
*H03K 5/00* (2006.01)

(52) U.S. Cl. ............... 438/380; 257/603; 257/E21.608; 327/552

(58) Field of Classification Search .................. 257/603; 438/380; 327/552
See application file for complete search history.

(56) References Cited

U.S. PATENT DOCUMENTS

| | | | |
|---|---|---|---|
| 5,880,511 A | 3/1999 | Yu et al. | |
| 5,990,511 A | 11/1999 | Leas | |
| 6,115,592 A | 9/2000 | Ueda et al. | |
| 6,121,669 A | 9/2000 | Kalb et al. | |
| 6,140,674 A | 10/2000 | Hause et al. | |
| 6,489,660 B1 | 12/2002 | Einthoven et al. | |
| 6,822,295 B2 | 11/2004 | Larson | |
| 6,953,980 B2 | 10/2005 | Escoffier et al. | |
| 6,984,860 B2 | 1/2006 | Grivna et al. | |
| 7,262,681 B2 | 8/2007 | Hurley | |
| 2003/0205775 A1 | 11/2003 | Einthoven et al. | |
| 2006/0181385 A1 | 8/2006 | Hurley | |
| 2007/0073807 A1 | 3/2007 | Bobde | |
| 2009/0079001 A1* | 3/2009 | Salih et al. ................... | 257/355 |

OTHER PUBLICATIONS

NUF9300 Data Sheet, Product Preview, "5-Line EMI Filter with ESD Protection", Copyright Semiconductor Components Industries, LLC, 2005, Apr. 2005—Rev. P1, Publication Order No. NUF9300/D, 6pps.
Data Sheet, Semtech, "uClamp3301D Low Voltage uClamp(tm) for ESD and CDE Protection, Protection Products—MicroClamp(tm)", Revision Oct. 25, 2004, Copyright 2004 Semtech Corp., 6pps.
Data Sheet, Semtech, RClamp0502B Ultra-Low Capacitance TVS for ESD and CDE Protection, Protection Products—RailClamp(r) Revision Apr. 5, 2005, Copyright 2005 Semtech Corp., 9pps.
Data Sheet, Semtech, "RClamp0514M RailClamp(r) Low Capacitance TVS Diode Array, Protection Products—RailClamp(r)", Revision Aug. 31, 2005, Copyright 2005 Semtech Corp., 11pps.
Data Sheet, Semtech, "RClamp05022P RClamp0524P Ultra Low Capacitance TVS Arrays, Protection Products—RailClamp(r)", Revision Sep. 19, 2006, Copyright 2006 Semtech Corp., 13pps.

* cited by examiner

*Primary Examiner* — Jarrett J Stark
*Assistant Examiner* — Lawrence Tynes, Jr.
(74) *Attorney, Agent, or Firm* — Robert F. Hightower

(57) ABSTRACT

In one embodiment, a plurality of ESD devices are used to form an integrated semiconductor filter circuit. Additional diodes are formed in parallel with the ESD structures in order to increase the input capacitance.

8 Claims, 5 Drawing Sheets

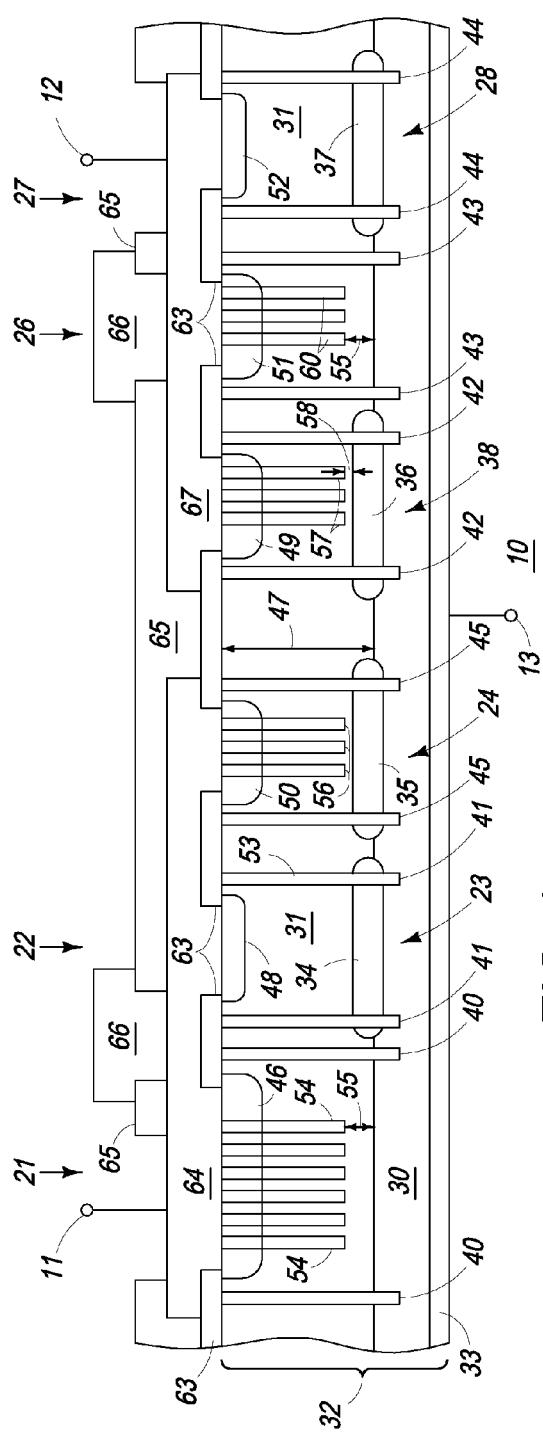
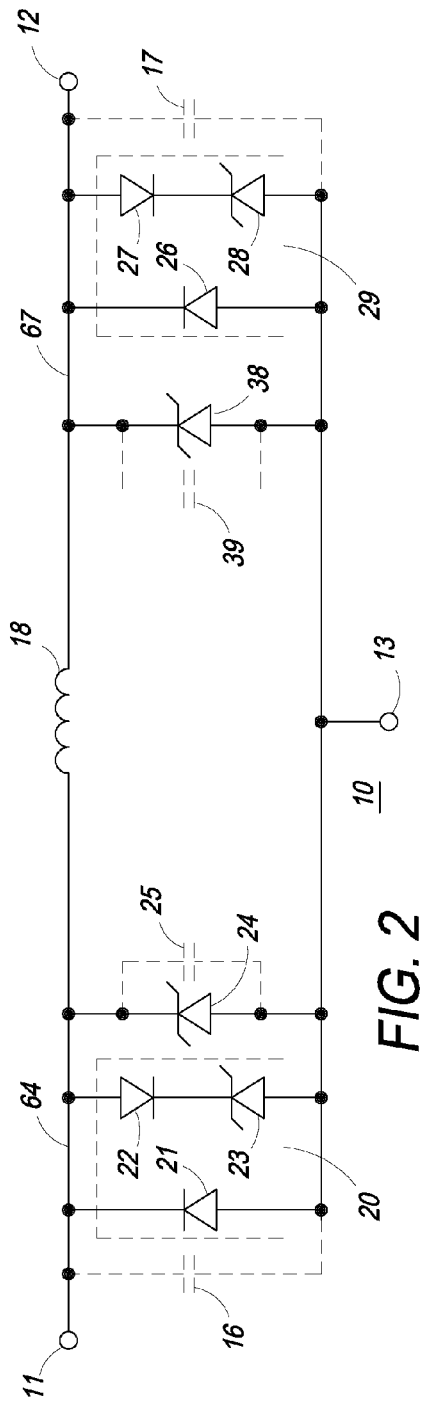
FIG. 1
FIG. 2

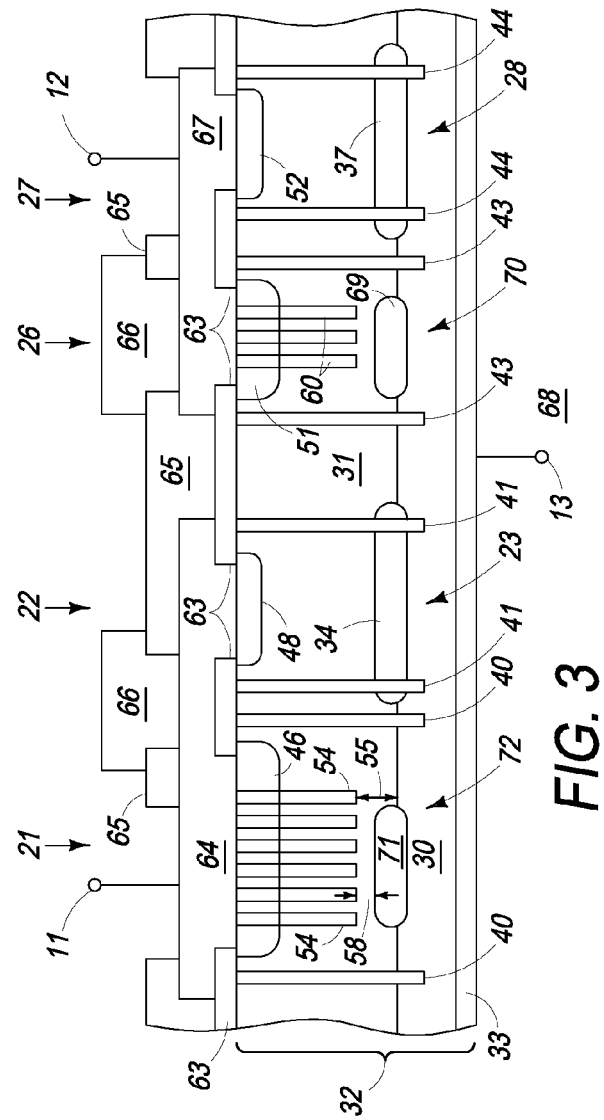
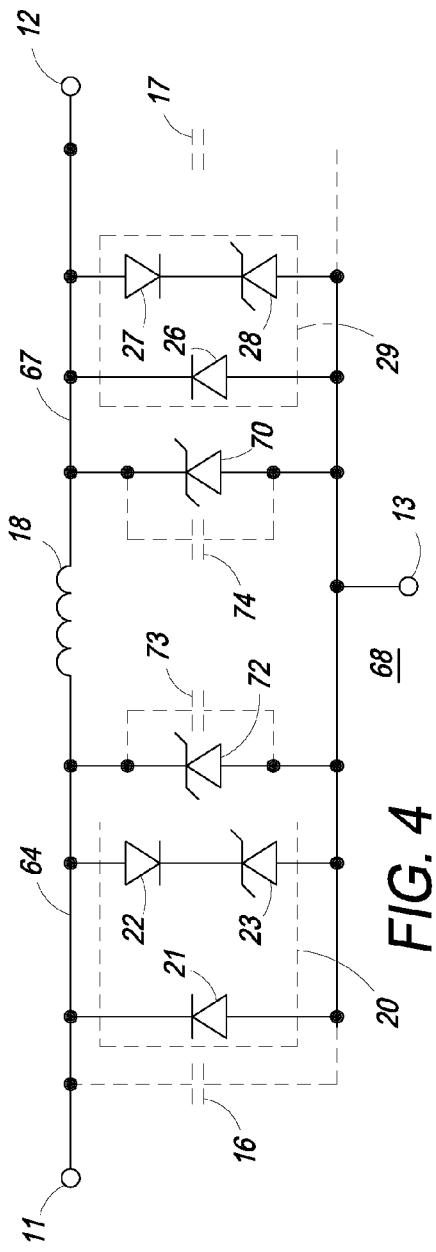
FIG. 3
FIG. 4

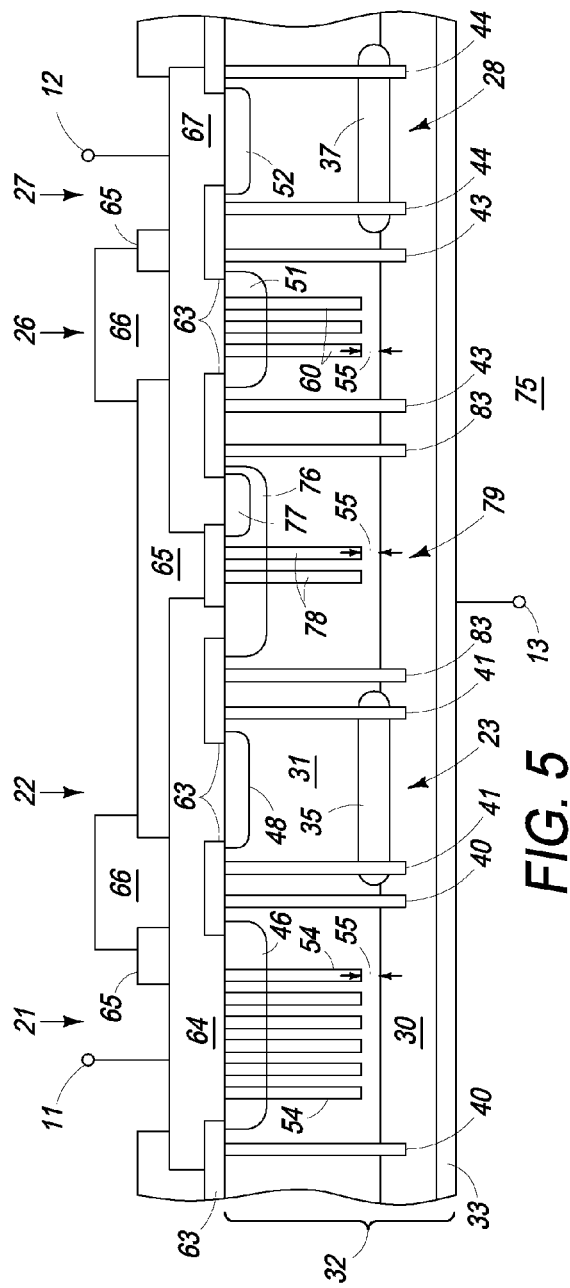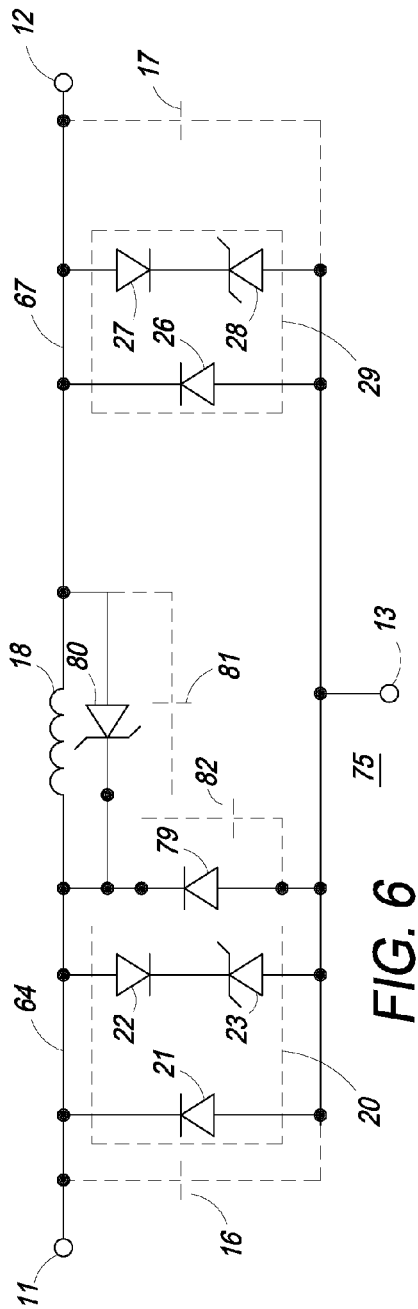

METHOD OF FORMING AN INTEGRATED SEMICONDUCTOR DEVICE AND STRUCTURE THEREFOR

CROSS-REFERENCE TO RELATED APPLICATIONS

This application is related to the following applications: an application entitled "METHOD OF FORMING LOW CAPACITANCE ESD DEVICE AND STRUCTURE THEREFOR" having an application Ser. No. 11/859,570, a common assignee, and inventors Keena et al., an application entitled "MULTI-CHANNEL ESD DEVICE AND METHOD THEREFOR" having an application Ser. No. 11/859,624, a common assignee, and inventors Salih et al., and an application entitled "LOW CLAMP VOLTAGE ESD DEVICE AND METHOD THEREFOR" having an application Ser. No. 12/170,630, a common assignee, and inventors Marreiro et al.

BACKGROUND OF THE INVENTION

The present invention relates, in general, to electronics, and more particularly, to semiconductors, structures thereof, and methods of forming semiconductor devices.

In the past, the semiconductor industry utilized various methods and structures to form integrated filter circuits. Prior integrated filter circuits usually were not able to have a fast electrostatic discharge (ESD) response and also have a high input capacitance. According to one international specification, the International Electrotechnical Commission (IEC) specification commonly referred to as IEC 61000-4-2 (level 2) (the IEC has an address at 3, rue de Varembé, 1211 Genève 20, Switzerland), for an ESD event the peak voltage could be between two thousand and thirty thousand volts (2000-30000 V) and could occur over a period of a few nanoseconds, typically less than two nanoseconds (2 nsec.) and could last for only about one nanosecond (1 nsec.). An ESD device should respond to the ESD event within approximately 1 nanosecond.

Accordingly, it is desirable to have a method of forming an integrated filter device that has a fast ESD response and that has a high input capacitance.

BRIEF DESCRIPTION OF THE DRAWINGS

FIG. 1 illustrates an enlarged cross-sectional view of a portion of an embodiment of an integrated semiconductor device in accordance with the present invention;

FIG. 2 schematically illustrates a circuit representation of the integrated semiconductor device of FIG. 1 configured as a Pi-type filter in accordance with the present invention;

FIG. 3 illustrates an enlarged cross-sectional view of a portion of an embodiment of another integrated semiconductor device that is an alternate embodiment of integrated semiconductor device of FIG. 1 in accordance with the present invention;

FIG. 4 schematically illustrates a circuit representation of the integrated semiconductor device of FIG. 3 in accordance with the present invention;

FIG. 5 illustrates an enlarged cross-sectional view of a portion of an embodiment of another integrated semiconductor device that is another alternate embodiment of the integrated semiconductor device of FIG. 1 in accordance with the present invention;

FIG. 6 schematically illustrates a circuit representation of the integrated semiconductor device of FIG. 5 in accordance with the present invention;

Figure 7:
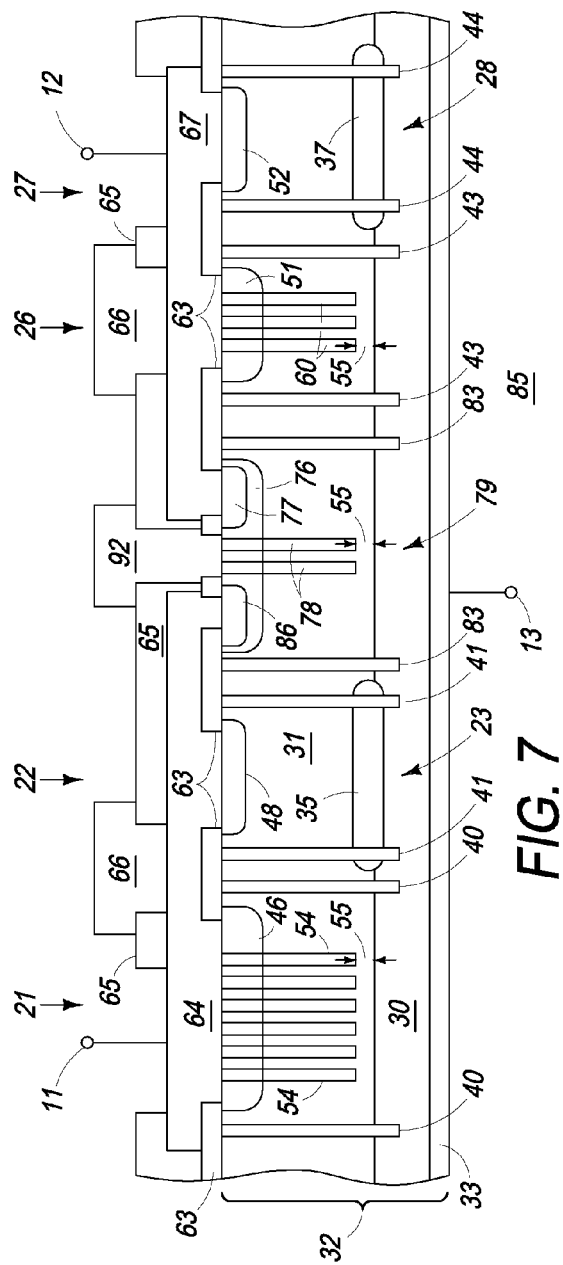
FIG. 7 illustrates an enlarged cross-sectional view of a portion of an embodiment of yet another integrated semiconductor device that is an alternate embodiment of device the integrated semiconductor device of FIG. 6 in accordance with the present invention.

For simplicity and clarity of the illustration, elements in the figures are not necessarily to scale, and the same reference numbers in different figures denote the same elements. Additionally, descriptions and details of well-known steps and elements are omitted for simplicity of the description. As used herein current carrying electrode means an element of a device that carries current through the device such as a source or a drain of a MOS transistor or an emitter or a collector of a bipolar transistor or a cathode or anode of a diode, and a control electrode means an element of the device that controls current through the device such as a gate of a MOS transistor or a base of a bipolar transistor. Although the devices are explained herein as certain N-channel or P-Channel devices, or certain N-type or P-type doped regions, a person of ordinary skill in the art will appreciate that complementary devices are also possible in accordance with the present invention. It will be appreciated by those skilled in the art that the words during, while, and when as used herein relating to circuit operation are not exact terms that mean an action takes place instantly upon an initiating action but that there may be some small but reasonable delay, such as a propagation delay, between the reaction that is initiated by the initial action. The use of the word approximately or substantially means that a value of an element has a parameter that is expected to be very close to a stated value or position. However, as is well known in the art there are always minor variances that prevent the values or positions from being exactly as stated. It is well established in the art that variances of up to at least ten percent (10%) (and up to twenty percent (20%) for semiconductor doping concentrations) are reasonable variances from the ideal goal of exactly as described. For clarity of the drawings, doped regions of device structures are illustrated as having generally straight line edges and precise angular corners. However, those skilled in the art understand that due to the diffusion and activation of dopants the edges of doped regions generally may not be straight lines and the corners may not be precise angles.

DETAILED DESCRIPTION OF THE DRAWINGS

FIG. 1 illustrates an enlarged cross-sectional view of a portion of an embodiment of an integrated semiconductor device 10. In the preferred embodiment, device 10 is formed with a circuit configuration of an integrated semiconductor filter.

FIG. 2 schematically illustrates a circuit representation of integrated semiconductor device 10 configured as a Pi-type filter having two branches and a center inductor 18. This description has references to FIG. 1 and FIG. 2. Device 10 includes two input/output terminals 11 and 12 in addition to a common terminal 13. One branch of the Pi-type filter includes a diode structure having a plurality of diodes that includes diodes 21 and 22 in addition to zener diodes 23 and 24. Diodes 21 and 22 along with zener diode 23 form an electrostatic discharge (ESD) device 20. Another branch of the Pi-type filter includes another diode structure having a plurality of diodes that includes diodes 26 and 27 in addition to zener diodes 28 and 38. Diodes 26 and 27 along with zener diode 28 form an ESD device 29. Because of ESD devices 20 and 29, device 10 may be used in applications that require a filter and that can also use the ESD protection provided by devices 20 and 29. In a typical application one of terminals 11 or 12 is used as an input while the other of terminals 11 or 12 is used as an output. Both the input and output usually are referenced to common terminal 13. The input terminal generally is driven with signals that are to be filtered by the filter. In most applications, the input signal has a range between about a few tenths of a volt to about ten volts (0V-10V). For these signal ranges, ESD devices 20 and 29 function as capacitors 16 and 17, respectively, of the filter. Capacitors 16 and 17 are illustrated by dashed lines because they are formed by the junction capacitances of the diodes of ESD devices 20 and 29.

Device 10 is configured to have a very low clamp voltage between terminals 11 and 13 and between 12 and 13 during an ESD event and to have a low capacitance value for capacitors 16 and 17. The low capacitance assists in providing device 10 with a fast response time to an ESD event. Furthermore, device 10 is formed to have a sharp knee or sharp breakdown voltage characteristic that assists in accurately controlling the value of the clamp voltage. If an ESD event is received on terminal 11, terminal 11 is forced to a positive voltage relative to terminal 13. The positive voltage forward biases diode 22 and reverse biases diodes 21, 23, and 24. As the voltage between terminals 11 and 13 reaches the positive threshold voltage of device 10 (the forward voltage of diode 22 plus the zener voltage of diode 23) a positive current flows from terminal 11 through diodes 22 and 23 to terminal 13. Device 10 clamps the maximum voltage formed between terminals 11 and 13, thus the clamp voltage, to approximately the zener voltage of diode 24. The value of this threshold voltage is formed to be greater than the value of the signals received between terminal 11 and 13 (or 12 and 13) during normal operation of device 10.

The capacitance of an ESD device is customarily specified with zero volts applied across the device. This zero voltage condition is normally referred to as a zero bias condition. The zero bias input capacitance, such as the low frequency, such as frequencies no greater than about one mega-hertz (1 Mhz), capacitance seen looking into one of terminals 11 or 12. The value of the zero bias input capacitance affects the filtering characteristics of device 10. In the preferred embodiment, it is desired to have the zero bias input capacitance of device 10 to be between five to fifteen pico-farads in order to obtain specific filtering characteristics. The value of each of capacitors 16 or 17 generally is less than this desired value. The capacitance of either of capacitors 16 or 17 at zero bias generally is less than about one (1) pico-farad and preferably is no greater than about 0.5 pico-farads. In order to increase the value of the zero bias input capacitance of device 10, capacitors 25 and 39 are formed in parallel with respective capacitors 16 and 17. Because of the additional capacitance provided by capacitors 25 and 39, the zero bias input capacitance of respective terminals 11 and 12 is approximately five to fifteen pico-farads (5-15 pf).

Referring to FIG. 1, diodes 21, 22, 23, 24, 26, 27, 28, and 38 are identified in a general manner by arrows. Device 10 is formed on a bulk semiconductor substrate 30. A semiconductor layer 31 is formed on substrate 30, such as by epitaxial growth or by doping a portion of substrate 30 to form layer 31. Substrate 30 and layer 31 form a semiconductor substrate 32. Terminal 13 usually is formed by forming a conductor 33, such as a metal, on the bottom surface of substrate 30 and providing a connection from conductor 33 to terminal 13.

Semiconductor regions 34, 35, 36, and 37 are formed near the interface of the dopants that form layer 31 and the dopants of substrate 30 in order to form respective diodes 23, 24, 38, and 28. In the preferred embodiment, substrate 30 is formed with a P-type conductivity having a doping concentration that is no less than approximately $1 \times 10^{19}$ atoms/cm$^3$ and preferably is between approximately $1 \times 10^{19}$ and $1 \times 10^{21}$ atoms/cm$^3$. In this preferred embodiment, semiconductor regions 34, 35, 36, and 37 are formed as N-type regions having a peak doping concentration that is no less than approximately $1 \times 10^{17}$ atoms/cm$^3$ and preferably is between approximately $1 \times 10^{19}$ and $1 \times 10^{21}$ atoms/cm$^3$. Those skilled in the art will appreciate that the doping concentration of regions 34, 35, 36, and 37 affect the breakdown voltage, thus the clamping voltage, of device 10 and that the doping concentration may be different to achieve different breakdown voltages. Additionally, the thickness of regions 34, 35, 36, and 37 generally are less than one micron and preferably are between about one to three (1-3) microns. Because of the small thickness of regions 34, 35, 36, and 37 in addition to the high doping concentration of substrate 30 and regions 34, 35, 36, and 37 forms zener diodes 23, 24, 28, and 38 with a very sharp transition or knee and allows very accurate control over the breakdown voltage or zener voltage of these diodes.

Layer 31 preferably is formed to have a lower peak doping concentration that is at least one order of magnitude less than the doping concentration of regions 34, 35, 36, and 37 and generally is between about $1 \times 10^{13}$ and $1 \times 10^{17}$ atoms/cm$^3$. Layer 31 and regions 35, 34, 36, and 37 may be formed on substrate 30 by a variety of methods that are well known to those skilled in the art. For example, a thin N-type epitaxial layer, (not shown) may be formed on substrate 30 as a first portion of layer 31. This first portion may be doped to form regions 35, 34, 36, and 37. Thereafter, the remainder of layer 31 may be formed.

Diode 22 includes a doped region 48 that is formed on the surface of layer 31 with the same conductivity as substrate 30. Region 48 is formed to extend into layer 31 and overlie region 34. The portion of layer 31 that is between regions 48 and 34 forms a drift region of diode 22. A thickness 47 of layer 31 usually is approximately two to twenty (2-20) microns and preferably is about seven (7) microns.

An isolation region, such as an isolation trench 41, is formed in order to isolate the portion of layer 31 where diodes 22 and 23 are formed from other portions of layer 31. In some cases, trench 41 reduces the capacitance of diode 22 by reducing the amount of layer 31 that is near region 48. Trench 41 generally is formed by creating openings from a top surface of layer 31, through layer 31, and extending into substrate 30. Trench 41 may also extend through region 34 a distance into substrate 30 in order to prevent conduction laterally through region 34. Trench 41 is provided with isolation such as by forming a dielectric liner 53 along the sidewalls and bottoms of trench 41 and filling the remaining of the opening with a dielectric or with doped or undoped polysilicon. Alternately, dielectric liner 53 may be formed along the sidewalls but not the bottom of trench 41 and the remainder of the opening may be filled with a dielectric or with a material that has the conductivity and doping of substrate 30. The lined sidewalls prevent forming a P-N junction between trench 41 and layer 31 because such a junction would increase the capacitance of ESD device 20. Methods to form trench 41 are well known to those skilled in the art. Trench 41 preferably is formed as a closed polygon with a periphery that has an opening which encloses a portion of layer 31, thus, trench 41 may be regarded as a multiply-connected domain. Preferably, trench 41 is one continuous trench that is formed to enclose region 48 and a portion of the interface between region 34 and substrate 30. Similarly, a doped region 52 is formed on the surface of layer 31 and to overlie region 37 to assist in forming diode 27. Doped region 52 is formed substantially the same as region 48 and has substantially the same doping type, doping concentration, and carrier concentration as region 48. An isolation region, such as an isolation trench 44, is formed in order to isolate the portion of layer 31 where diodes 27 and 28 are formed from other portions of layer 31. Trench 44 is formed similarly to trench 41. In some cases, trench 44 reduces the capacitance of diode 27 by reducing the amount of layer 31 that is near region 52.

The peak doping concentration of regions 48 and 52 generally is greater than the peak doping concentration of layer 31 and preferably is approximately equal to the peak doping concentration of substrate 30. Regions 48 and 52 generally are formed to extend a distance no greater than about two (2) microns and preferably about one tenth to two (0.1-2) microns from the surface into layer 31. The large differential doping concentration, such as about three to five (and preferably five) orders of magnitude, between region 48 and layer 31, and between region 52 and layer 31, provides diodes 22 and 27 a sharp knee. The low doping concentration and to a lesser degree the shallow depth of regions 48 and 52 assist in providing diodes 22 and 27 with a very small zero bias capacitance.

A doped region 46 is formed in layer 31 with the opposite conductivity to substrate 30 in order to form an ohmic contact to diode 21. Similarly, a doped region 51 is formed in layer 31 with the opposite conductivity to substrate 30 in order to form an ohmic contact to diode 26. Regions 46 and 51 are formed on the surface of layer 31 and preferably extend approximately the same distance into layer 31 as regions 48 and 52. The interface between substrate 30 and the portion of region 31 surrounded by trenches 40 and 43 each forms a P-N junction that functions as respective diodes 21 and 26. Region 46 is positioned so that the periphery of region 46, such as the periphery at the surface of layer 31, is completely surrounded by an isolation region such as an isolation trench 40, and region 51 is positioned so that the periphery of region 51, such as the periphery at the surface of layer 31, is completely surrounded by an isolation region such as an isolation trench 43. Each of trenches 40 and 43 preferably are formed as one continuous trench. Because trenches 40 and 43 extend through layer 31, they restrict the area of the junction formed within the enclosed area of interface between layer 31 and substrate 30 thereby assisting in reducing the capacitance of respective diodes 21 and 26. In the preferred embodiment, regions 46 and 51 have a doping type that is the same as layer 31 and a peak doping concentration that is greater than the peak doping concentration of layer 31 and preferably is approximately equal to the peak doping concentration of substrate 30. Trenches 40 and 43 generally are formed substantially similarly to trenches 41 and 44.

A doped region 50 is formed in layer 31 with the opposite conductivity to substrate 30 in order to assist in forming diode 24. Region 50 is formed to overlie region 35. An isolation region such as an isolation trench 45 is formed so that the periphery of region 50, such as the periphery at the surface of layer 31, is completely surrounded by trench 45. Trench 45 extends through layer 31 and a portion of region 35 into substrate 30. The interface between substrate 30 and the portion of region 35 that is surrounded by trench 45 forms a P-N junction that functions as diode 24. Similarly, a doped region 49 is formed in layer 31 with the opposite conductivity to substrate 30 in order to assist in forming diode 38. Region 49 is formed to overlie region 36. An isolation region such as an isolation trench 42 is formed so that the periphery of region 49, such as the periphery at the surface of layer 31, is completely surrounded by trench 42. Trench 42 extends through layer 31 and a portion of region 36 into substrate 30. The interface between substrate 30 and the portion of region 36 that is surrounded by trench 42 forms a P-N junction that functions as diode 38. Regions 49 and 50 are formed on the surface of layer 31 and preferably extend approximately the same distance into layer 31 as regions 46 and 51. Each of trenches 42 and 45 preferably are formed substantially similar to trenches 41 and 44. In the preferred embodiment, regions 49 and 50 have the same doping type as layer 31 and a peak doping concentration that is greater than the peak doping concentration of layer 31 and preferably is approximately equal to the peak doping concentration of substrate 30. Under normal operation, diodes 24 and 38 are reverse biased and the depletion region of the respective P-N junctions forms respective capacitors 25 and 39. The area of each of the P-N junctions is selected to give respective capacitors 25 and 39 capacitance values that, when combined with the value of respective capacitors 16 and 17, provides the desired five to fifteen pico-farad (5-15 pf) input capacitance at respective terminals 11 and 12. The size of these areas may be changed to permit independent adjustment of the value of associated capacitors 16 and 17. Those skilled in the art will appreciate that additional copies of the structures used to form diode 21 or diode 26 may be added to device 10 to add additional capacitors to increase the zero bias input capacitance of either or both of terminals 11 or 12. For example, another isolation region similar to trench 40 may be formed and another doped region similar to doped region 46 along with conductors similar to conductors 54 may be formed within the region that is surrounded by the additional isolation region.

A conductor 54, and preferably a plurality of conductors 54, is formed to extend from the surface of layer 31, through region 46 and into layer 31. Conductors 54 reduce the resistance for current that flows through the drift region of layer 31 that underlies region 46. Conductors 54 preferably are formed with a proximate end near to the surface of layer 31 and a distal end near to an interface of substrate 30 and the portion of layer 31 that is surrounded by trench 40, thus, near to the P-N junction of diode 21. The distal end of conductors 54 usually is formed to be no closer than a distance 55 from the P-N junction interface. Distance 55 is selected to keep conductors 54 away from the depletion region that is formed during the normal operation of device 10 by the P-N junction of diode 21. If the distal end of conductors 54 are too close to the depletion region formed by the P-N junction, the capacitance value of capacitor 16 is increased and would be a larger value than the desired zero bias value and also would be larger during the operation of device 10. Preferably distance 55 is no closer to the interface of the P-N junction than about one or two (1-2) microns. This increased capacitance value could affect the ESD operation of device 10. Conductors 54 generally are formed by making an opening that extends from the surface of layer 31 a depth into layer 31. Thereafter, the opening is filled with a conductor, such as doped polysilicon, in order to form conductors 54. A heat cycle may be used after the opening is filled with doped polysilicon. If conductors 54 are formed from doped semiconductor material, the material has the same conductivity type as layer 31. The resistivity of the material used to form conductors 54 is less than the resistivity of the material of layer 31 and usually is significantly less than the resistivity of the material of layer 31. In the preferred embodiment, conductors 54 are formed from N-type doped polysilicon having a doping concentration that is no less than approximately $1\times10^{19}$ atoms/cm$^3$ and preferably is between approximately $1\times10^{19}$ and $1\times10^{21}$ atoms/cm$^3$. Similarly, a conductor 60, and preferably a plurality of conductors 60, is formed to extend from the surface of layer 31, through region 51 and into layer 31. Conductors 60 preferably are formed with a proximate end near to surface of layer 31 and a distal end that is near to the P-N junction of diode 26. Conductors 60 are substantially the same as conductors 54 and are formed in substantially the same manner.

A conductor 56, and preferably a plurality of conductors 56, is formed to extend from the surface of layer 31, through region 50 and into layer 31. Conductors 56 preferably are formed with a distal end near to region 35. Conductors 56 reduce the resistance for current that flows through the drift region of layer 31 that underlies region 50. Conductors 56 may intersect with region 35 without substantially affecting the value of the capacitors of device 10. Similarly, a conductor 57, and preferably a plurality of conductors 57, is formed to extend from the surface of layer 31, through region 49 and into layer 31. Conductors 57 preferably are formed with a distal end near to region 36. Conductors 57 reduce the resistance for current that flows through the drift region of layer 31 that underlies region 49. Conductors 57 may intersect with region 36 without substantially affecting the value of the capacitors of device 10. Conductors 56 and 57 may be formed using techniques that are similar to the ones used to form conductors 54 and 60. Although conductors 54, 56, 57, and 60 are illustrated to have the same depth into substrate 32, those skilled in the art will appreciate that different depths may be used. In some embodiments, the vertical resistance through layer 31 is low enough to provide the desired high frequency filter characteristics so that all or a portion of conductors 54, 56, 57, and 60 may be omitted.

Figure 9:
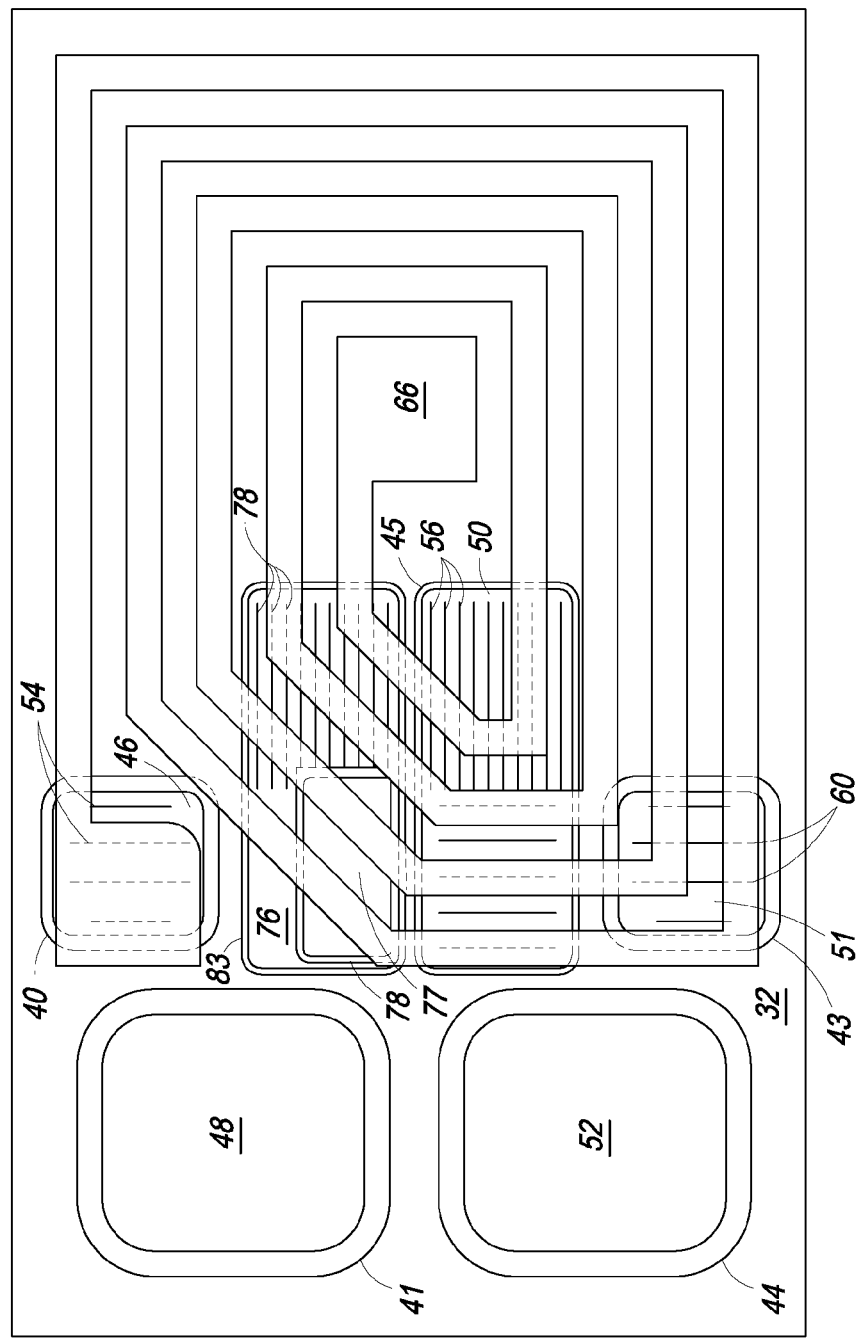
FIG. 9 illustrates an enlarged plan view of a portion of an embodiment of the integrated semiconductor device of FIG. 5 in accordance with the present invention.

Subsequently, a dielectric 63 may be formed on the surface of layer 31. Openings generally are formed through dielectric 63 to expose portions of regions 46, 48, 49, 50, 51, and 52 in order to form electrical connections thereto. A conductor material usually is applied and patterned to form conductors 64 and 67. Conductor 64 electrically connects the cathode of diode 21 to the anode of diode 22, to the cathode of diode 24, and to terminal 11. Conductor 67 electrically connects the cathode of diode 38 to the cathode of diode 26, to the anode of diode 27, and to terminal 12. A dielectric 65 generally is then applied and patterned to form openings that facilitate electrically contacting portions of conductors 64 and 67. A conductor layer is applied and patterned to form a conductor 66. As can be seen in FIG. 9, a portion of conductor 66 extends laterally across the surface of device 10 to form inductor 18.

In the preferred embodiment illustrated in FIGS. 1 and 2, device 10 is symmetrical so that terminals 11 and 12 are interchangeable. In order to provide the symmetrical configuration, both branches of the filter have substantially the same zero bias capacitance. Thus, the size of the P-N junctions of each branch usually are substantially similar, and form a capacitance value approximately equal to half of the zero bias input capacitance. The low frequency zero bias capacitance of the parallel combination of capacitors 16 and 25 is approximately two and one-half to seven and on-half pico-farads (2.5-7.5 pf). Similarly, the low frequency zero bias capacitance of the parallel combination of capacitors 17 and 39 is also approximately two and one-half to seven and on-half pico-farads (2.5-7.5 pf). In normal operation, the filter configuration attenuates the higher frequency components, such as frequencies that are greater than about five hundred Mega-Hertz (500 Mhz), of the signals that are applied to the one of terminals 11 or 12 that is selected to be the input terminal. Inductor 18 usually has a value that is no less than, and preferably is greater than, about ten nano-henries (10 nH).

In order to facilitate this functionality for device 10, terminal 11 is commonly connected to a cathode of diode 21 and an anode of diode 22 (and to a first terminal of equivalent capacitor 16), a cathode of diode 24 (and to a first terminal of equivalent capacitor 25), and a first terminal of inductor 18. Terminal 13 is commonly connected to an anode of diode 21, an anode of diode 23 (and to a second terminal of equivalent capacitor 16), an anode of diode 24 (and to a second terminal of equivalent capacitor 25), an anode of diode 38 (and to a first terminal of equivalent capacitor 39), an anode of diode 26, and an anode of diode 28 (and to a first terminal of equivalent capacitor 17). Terminal 12 is commonly connected to an anode of diode 27, a cathode of diode 26 (and to a second terminal of equivalent capacitor 17), a cathode of diode 38 (and to a second terminal of equivalent capacitor 39), and to a second terminal of inductor 18. As can be seen from all of the preceding and as illustrated in FIG. 2, device 10 includes a first diode coupled between the first and third terminals, a second diode, a first zener diode coupled in series with the second diode wherein the series combination of the second diode and the first zener diode is coupled in parallel with the first diode and wherein the first diode, the second diode, and the first zener diode form a first capacitor having a first capacitance value; a third diode coupled between the second and third terminals, a fourth diode; a second zener diode coupled in series with the fourth diode wherein the series combination of the fourth diode and the second zener diode is coupled in parallel with the third diode and wherein the third diode, the fourth diode, and the second zener diode form a second capacitor having a second capacitance value, a fifth diode coupled in parallel with the third diode wherein the fifth diode forms a third capacitor having a third capacitance value and wherein the third diode, the fourth diode, the fifth diode, and the second zener diode form a first branch capacitor of the integrated semiconductor filter, the first branch capacitor having a fourth capacitance value that is approximately two and one-half to seven and one-half pico-farads at frequencies that are no greater than one Mhz; and an inductor coupled to at least the second terminal of the integrated semiconductor filter.

FIG. 3 illustrates an enlarged cross-sectional view of a portion of an embodiment of an integrated semiconductor device 68 that is an alternate embodiment of device 10 that was explained in the description of FIG. 1-FIG. 2.

FIG. 4 schematically illustrates a circuit representation of integrated semiconductor device 68 configured as a Pi-type filter having two branches and center inductor 18. This description has references to FIG. 3 and FIG. 4. Device 68 is similar to device 10 except that device 68 does not include diodes 24 and 38 and the capacitors associated therewith. Therefore, device 68 does not include regions 35, 36, 49, 50, trenches 45 and 42, and conductors 56 and 57 of device 10. Device 68 is similar to device 10 except that device 68 includes a diode 72 (and a corresponding equivalent capacitor 73) instead of diode 24 and includes a diode 70 (and a corresponding equivalent capacitor 74) instead of diode 38. Diodes 70 and 72 are formed differently than diodes 24 and 38. Device 68 includes regions 69 and 71 that are formed similarly to regions 34 and 37 and with substantially the same doping concentration and doping type. Region 69 is formed underlying region 51 and surrounded by a trench 43. Region 71 is formed underlying the region 46 and surrounded by trench 40. The interface between region 69 and substrate 30 forms a P-N junction that functions as diode 70. Similarly, the interface between region 71 and substrate 30 forms another P-N junction that functions as diode 72. Inserting regions 69 or 71 results in a larger capacitance value for respective capacitors 74 and 73 than there would be without regions 69 and 71. The area of the P-N junction resulting from the interface of region 69 and substrate 30 is selected to form a capacitance value for capacitor 74 such that the combination of capacitors 74 and 17 form the desired capacitance for the branch that is connected to terminal 12. Similarly, the area of the P-N junction formed by the interface of substrate 30 and region 71 is selected to be sufficiently large to provide a capacitance value for capacitor 73 so that capacitor 73 in combination with capacitor 16 forms the desired capacitance for the branch that is connected to terminal 11. The size of either or both of regions 69 and 71 may expand so that respective trenches 44 and 40 intersect the respective regions. In this embodiment, diode 26 is formed between substrate 30 and the part of region 31 that is located between region 69 and isolation trench 43. Similarly, diode 21 is formed between substrate 30 and the part of region 31 that is located between region 71 and trench 40.

FIG. 5 illustrates an enlarged cross-sectional view of a portion of an embodiment of an integrated semiconductor device 75 that is another alternate embodiment of device 10 that was explained in the description of FIG. 1-FIG. 2. In the preferred embodiment, device 10 is formed with the circuit configuration of another integrated semiconductor filter.

FIG. 6 schematically illustrates a circuit representation of integrated semiconductor device 75 configured as a third order Chebychev filter having two branches, center inductor 18, and a shunt capacitor 81. This description has references to FIG. 5-FIG. 6. Device 75 is similar to device 10 except that device 75 does not include diodes 24 and 38 and capacitors 25 and 39 associated therewith. Therefore, device 75 does not include regions 35, 36, 49, 50, and conductors 56 and 57 of device 10. Device 75 includes a diode 79, and an equivalent capacitor 82 formed thereby, that is configured in parallel with ESD device 20. Device 75 also includes another zener diode 80, and an equivalent capacitor 81 formed thereby, that is connected in parallel with inductor 18. For DC and low frequency measurements, such as at frequencies less than about 1 MHz, capacitors 16, 17, and 82 are all in parallel. Thus, the input capacitance looking into either of terminals 11 or 12 includes capacitors 16, 17, and 82 in parallel. The value of these three capacitors combine to form the zero bias input capacitance. However, during an ESD event, terminal 11 will have a different capacitance than terminal 12, therefore, device 75 is not a symmetrical device and terminals 11 and 12 are not interchangeable for ESD events. Diode 80 is formed to provide a value for capacitor 81 that provides the desired high-frequency response for the filter formed by device 75.

Device 75 includes a doped region 76 that is formed similarly to and with substantially the same doping type and profile as regions 46 and 51. Another doped region 77 is formed within region 76 so that the P-N junction between regions 76 and 77 forms diode 80. The area of P-N junction formed between regions 76 and 77 is selected to provide the value for capacitor 81 that results in the desired high frequency response of the filter formed by device 75. The size of this area may be changed to permit independent adjustment of the value of capacitor 81. Region 77 generally is formed similar to and with substantially the same doping type and profile as regions 48 and 52. In some embodiments, region 76 may be formed to a depth that is greater than any of regions 46, 48, 51, or 52 in order to provide sufficient depth for region 76. In the preferred embodiment, regions 46, 76, and 51 are formed at the same time and all have the same depth into layer 31, and region 77 has sufficient depth for forming region 76. An isolation region, such as an isolation trench 83, is formed to extend from the surface of layer 31 into substrate 30 and with a periphery that surrounds region 76 in order to prevent current flow from region 76 laterally through layer 31 to other portions of device 75. The P-N junction formed at the interface between substrate 30 and the portion of layer 31 that is enclosed by trench 83 forms diode 79. The area of this P-N junction is selected to provide capacitor 82 a capacitance value that when combined with capacitor 16, provides the desired zero bias input capacitance for terminal 11. The size of this area may be changed to permit independent adjustment of the value of capacitor 82. Conductors 78 are formed to extend from the surface of layer 31 through region 76 and into layer 31 in order to reduce the resistance for current flow between terminal 11 and the cathode of diodes 79 and 80. Conductors 78 are formed similarly to conductors 54 and 60.

In order to provide a connection between terminal 11 and the cathode of diodes 79 and 80, an opening is formed through dielectric 63 that allows conductor 64 to electrically contact region 76. Additionally, another opening through dielectric 63 allows making electrical contact between conductor 67 and region 77. Those skilled in the art will appreciate that diode 79 can be moved to the other branch of the filter by positioning region 77 under conductor 64 instead of under conductor 67. This also rotates the polarity of diode 80 so that the anode is connected to terminal 11 and the cathode is connected to terminal 12.

Those skilled in the art will also appreciate that regions 50, 35, trench 45, and conductors 56 and/or regions 49, 36, trench 42 and conductors 57 of FIG. 1 may be used to provide device 75 additional capacitors to change the zero bias input capacitance or to shape the high frequency characteristics. Additionally regions 69 and 71 (FIG. 3) may also be used to provide device 75 additional capacitors to change the zero bias input capacitance or to shape the high frequency characteristics. Furthermore, combinations of these elements from FIG. 1 and FIG. 2 may also be used.

As can be seen from the preceding, a method of forming device 75 includes the steps of providing a semiconductor substrate of a first conductivity type, forming a first doped region of a second conductivity type on a surface of the semiconductor substrate, forming a second doped region of the first conductivity type on a surface of the first doped region wherein the second doped region and the first doped region form a first diode, forming a third doped region of the second conductivity type on the surface of the semiconductor substrate and underlying the second doped region wherein the third doped region and a first portion of the semiconductor substrate form a first zener diode, forming a fourth doped region of the second conductivity type on the surface of the first doped region and spaced laterally apart from the second doped region wherein an interface between the semiconductor substrate and a first portion of the first doped region that underlies the fourth doped region forms a second diode, and forming a first isolation region extending from the surface of the first doped region into the semiconductor substrate wherein the first isolation region has a periphery that surrounds an interface between the semiconductor substrate and a second portion of the first doped region wherein the second portion of the first doped region does not underlie the first, second, third, or fourth doped regions and wherein the interface between the semiconductor substrate and the second portion of the first doped region forms a third diode that is in parallel with the second diode.

FIG. 7 illustrates an enlarged cross-sectional view of a portion of an embodiment of an integrated semiconductor device 85 that is an alternate embodiment of device 75 that was explained in the description of FIG. 5-FIG. 6.

Figure 8:
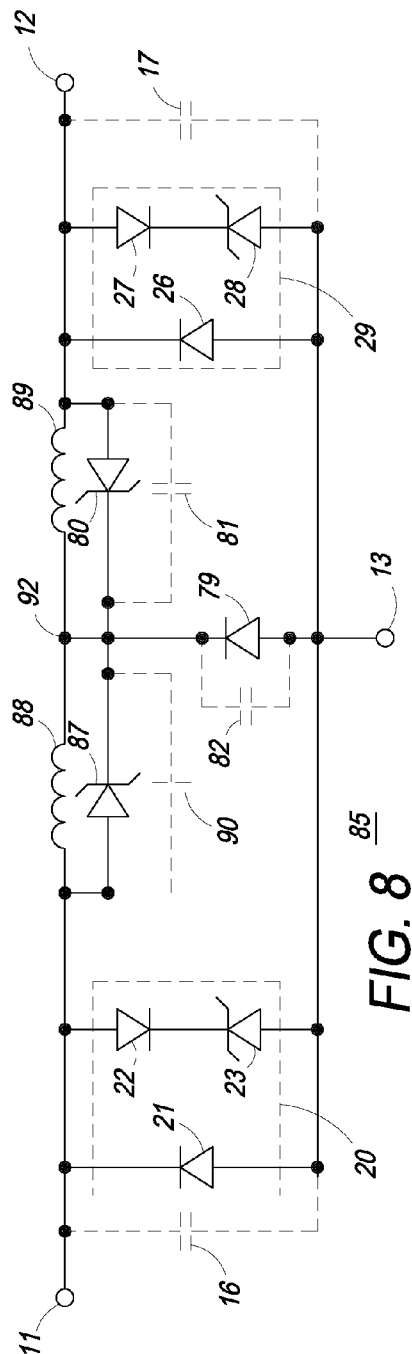
FIG. 8 schematically illustrates a circuit representation of the integrated semiconductor device of FIG. 8 in accordance with the present invention.

FIG. 8 schematically illustrates a circuit representation of integrated semiconductor device 85 configured as a fifth order Chebychev filter having three branches, two series inductors, and two shunt capacitors. This description has references to FIG. 7 and FIG. 8. Device 85 is similar to device 75 except that device 85 includes a doped region 86 that is formed within region 76 and spaced apart from region 77. Region 86 is similar to region 77 except that region 86 makes electrical contact to conductor 64 while region 77 makes electrical contact to conductor 67. The interface between regions 76 and 86 forms a P-N junction that forms diode 87 and an associated equivalent capacitor 90. Additionally, an opening is made through dielectrics 65 and 63 to expose a portion of region 76 that is between regions 77 and 86. Another conductor 92 is formed through the opening to make electrical contact region 76. Conductor 92 splits inductor 18 of FIG. 1 into two inductors, represented by a first inductor 88 and second inductor 89. Conductor 92 forms a common node between inductors 88 and 89, and diodes 79, 80, and 87.

FIG. 9 illustrates an enlarged plan view of a portion of an embodiment of device 75 that was explained in the description of FIGS. 6 and 7. The plan view illustrates one embodiment that forms conductor 66 in a spiral configuration which in conjunction with conductors 64 and 67 provides the desired inductance value for inductor 18. Conductors 64 and 67 are not represented in FIG. 9 for clarity of the 3 drawings. FIG. 9 also illustrates that conductors 54 and/or conductors 60 may be formed to extend laterally across the surface of device 10 in a stripe configuration or may be formed as a plurality of short elements. Portions of regions 46, 51, 76, and 77, portions of associated trenches 40, 43, and 83, and conductors 54, 60, and 78 are illustrated in dashed lines because they are covered by the conductor material of inductor 18.

In view of all of the above, it is evident that a novel device and method is disclosed. Included, among other features, is forming a device that has a fast response to an ESD event, a well controlled clamp voltage, that provides a filter function for frequencies that are greater than about 1 Mhz, and that also has a zero bias capacitance that is between about five to fifteen pico-farads. Also included is a method to form a filter that uses an ESD device in parallel to an additional diode to form the zero bias capacitance for the input branches. Because the ESD device has a highly doped P-type substrate and a lightly doped N-type layer on the substrate, the ESD device has a low capacitance. Forming the additional diode in parallel with the ESD device increases the zero bias capacitance to the desired value.

While the subject matter of the invention is described with specific preferred embodiments, it is evident that many alternatives and variations will be apparent to those skilled in the semiconductor arts. Additionally, the word "connected" is used throughout for clarity of the description, however, it is intended to have the same meaning as the word "coupled". Accordingly, "connected" should be interpreted as including either a direct connection or an indirect connection.

The invention claimed is:

1. A method of forming an integrated semiconductor device comprising:
   providing a semiconductor substrate of a first conductivity type;
   forming a first doped region of a second conductivity type on a surface of the semiconductor substrate;
   forming a second doped region of the first conductivity type on a surface of the first doped region wherein the second doped region and the first doped region form a first diode;
   forming a third doped region of the second conductivity type on the surface of the semiconductor substrate and underlying the second doped region wherein the third doped region and a first portion of the semiconductor substrate form a first zener diode that is coupled in series with the first diode;
   forming a fourth doped region of the second conductivity type on the surface of the first doped region and spaced laterally apart from the second doped region wherein an interface between the semiconductor substrate and a first portion of the first doped region that underlies the fourth doped region forms a second diode that is coupled in parallel with the series combination of the first diode and the first zener diode; and
   forming a fifth doped region of the second conductivity type on the surface of the semiconductor substrate wherein the fifth doped region and a second portion of the semiconductor substrate form a third diode that is coupled in parallel with the second diode.

2. The method of claim 1 further including forming a sixth doped region of the second conductivity type on the surface of the first doped region, the sixth doped region overlying the fifth doped region and spaced laterally apart from the second and fourth doped regions.

3. The method of claim 1 wherein forming the fifth doped region includes forming the fifth doped region underlying the fourth doped region and positioned so that the second portion of the semiconductor substrate underlies the fifth doped region.

4. The method of claim 1 further including forming a first isolation region extending from the surface of the first doped region into the semiconductor substrate wherein the first isolation region surrounds the fourth doped region and the first portion of the first doped region; and forming a second isolation region extending from the surface of the first doped region into the semiconductor substrate wherein the second isolation region surrounds the second doped region and at least a portion of the third doped region.

5. A method of forming an integrated semiconductor device comprising:
   providing a semiconductor substrate of a first conductivity type;
   forming a first doped region of a second conductivity type on a surface of the semiconductor substrate;
   forming a second doped region of the first conductivity type on a surface of the first doped region wherein the second doped region and the first doped region form a first diode;
   forming a third doped region of the second conductivity type on the surface of the semiconductor substrate and underlying the second doped region wherein the third doped region and a first portion of the semiconductor substrate form a first zener diode;
   forming a fourth doped region of the second conductivity type on the surface of the first doped region and spaced laterally apart from the second doped region wherein an interface between the semiconductor substrate and a first portion of the first doped region that underlies the fourth doped region forms a second diode;
   forming a first isolation region extending from the surface of the first doped region into the semiconductor substrate wherein the first isolation region has a periphery that surrounds an interface between the semiconductor substrate and a second portion of the first doped region wherein the second portion of the first doped region does not underlie the first, second, third, or fourth doped regions and wherein the interface between the semiconductor substrate and the second portion of the first doped region forms a third diode that is in parallel with the second diode;

forming a fifth doped region of the second conductivity type on the surface of the first doped region and spaced apart from the second and fourth doped regions wherein the fifth doped region overlies the second portion of the first doped region; and forming a sixth doped region of the first conductivity type within the fifth doped region wherein an interface between the fifth and sixth doped regions forms a fourth diode.

6. The method of claim 5 further including forming a seventh doped region of the first conductivity type within the fifth doped region and spaced apart form the sixth doped region wherein an interface between the fifth and seventh doped regions forms a fifth diode.

7. A method of forming an integrated semiconductor device comprising:

providing a semiconductor substrate of a first conductivity type;

forming a first doped region of a second conductivity type on a surface of the semiconductor substrate;

forming a second doped region of the first conductivity type on a surface of the first doped region wherein the second doped region and the first doped region form a first diode;

forming a third doped region of the second conductivity type on the surface of the semiconductor substrate and underlying the second doped region wherein the third doped region and a first portion of the semiconductor substrate form a first zener diode;

forming a fourth doped region of the second conductivity type on the surface of the first doped region and spaced laterally apart from the second doped region wherein an interface between the semiconductor substrate and a first portion of the first doped region that underlies the fourth doped region forms a second diode; and forming a first isolation region extending from the surface of the first doped region into the semiconductor substrate wherein the first isolation region has a periphery that surrounds an interface between the semiconductor substrate and a second portion of the first doped region wherein the second portion of the first doped region does not underlie the first, second, third, or fourth doped regions and wherein the interface between the semiconductor substrate and the second portion of the first doped region forms a third diode that is in parallel with the second diode; and forming a second isolation region extending from the surface of the first doped region into the semiconductor substrate wherein the second isolation region surrounds the fourth doped region and the first portion of the first doped region; and forming a third isolation region extending from the surface of the first doped region into the semiconductor substrate wherein the third isolation region surrounds the second doped region and at least a portion of the third doped region.

8. A method of forming an integrated semiconductor device comprising:

providing a semiconductor substrate of a first conductivity type;

forming a first doped region of a second conductivity type on a surface of the semiconductor substrate;

forming a second doped region of the first conductivity type on a surface of the first doped region wherein the second doped region and the first doped region form a first diode;

forming a third doped region of the second conductivity type on the surface of the semiconductor substrate and underlying the second doped region wherein the third doped region and a first portion of the semiconductor substrate form a first zener diode;

forming a fourth doped region of the second conductivity type on the surface of the first doped region and spaced laterally apart from the second doped region wherein an interface between the semiconductor substrate and a first portion of the first doped region that underlies the fourth doped region forms a second diode;

forming a first isolation region extending from the surface of the first doped region into the semiconductor substrate wherein the first isolation region has a periphery that surrounds an interface between the semiconductor substrate and a second portion of the first doped region wherein the second portion of the first doped region does not underlie the first, second, third, or fourth doped regions and wherein the interface between the semiconductor substrate and the second portion of the first doped region forms a third diode that is in parallel with the second diode; and forming an inductor having a first terminal coupled to the first, second, and third diodes.

* * * * *